(12) United States Patent
Azuma et al.

(10) Patent No.: US 6,979,866 B2
(45) Date of Patent: Dec. 27, 2005

(54) SEMICONDUCTOR DEVICE WITH SOI REGION AND BULK REGION AND METHOD OF MANUFACTURE THEREOF

(75) Inventors: Atsushi Azuma, Wappingers Falls, NY (US); Yusuke Kohyama, Poughkeepsie, NY (US); Kaori Umezawa, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/653,128

(22) Filed: Sep. 3, 2003

(65) Prior Publication Data

US 2004/0108552 A1    Jun. 10, 2004

(30) Foreign Application Priority Data

Sep. 4, 2002   (JP) .............................. 2002-259194

(51) Int. Cl.⁷ .................. H01L 27/01; H01L 27/12; H01L 31/0392
(52) U.S. Cl. .................. 257/347; 257/349; 257/250
(58) Field of Search ................ 257/751, 758, 257/760, 250, 347, 349

(56) References Cited

U.S. PATENT DOCUMENTS

| | | | |
|---|---|---|---|
| 6,342,717 B1 * | 1/2002 | Komatsu | 257/347 |
| 6,538,916 B2 * | 3/2003 | Ohsawa | 365/149 |
| 2001/0010380 A1 * | 8/2001 | Maeda | 257/365 |
| 2004/0183131 A1 * | 9/2004 | Nagano et al. | 257/347 |

FOREIGN PATENT DOCUMENTS

| | | |
|---|---|---|
| JP | 62-213272 | 9/1987 |
| JP | 2-252262 | 10/1990 |
| JP | 3-129765 | 6/1991 |
| JP | 4-186746 | 7/1992 |
| JP | 6-163677 | 6/1994 |
| JP | 8-17694 | 1/1996 |
| JP | 11-87718 | 3/1999 |
| JP | 11-112000 | 4/1999 |
| JP | 2000-277638 | * 6/2000 |
| JP | 2000-277638 | 10/2000 |
| JP | 2000-307117 | 11/2000 |
| JP | 2001-230423 | 8/2001 |
| TW | 466759 | 12/2001 |

OTHER PUBLICATIONS

T. Yamada, et al., "An Embedded DRAM Technology on SOI/Bulk Hybrid Substrate Formed with SEG Process for High-End SOC Application", 2002 IEEE, 2002 Symposium on VLSI Technology Digest of Technical Papers, 2 Pages.
U.S. Appl. No. 10/653,128, filed Sep. 3, 2003, Azuma et al.
U.S. Appl. No. 10/850,106, filed May 21, 2004, Kohyama.

* cited by examiner

*Primary Examiner*—Phat X. Cao
(74) *Attorney, Agent, or Firm*—Oblon, Spivak, McClelland, Maier & Neustadt, P.C.

(57) ABSTRACT

In the SOI region of a semiconductor substrate, a BOX layer is formed underneath with backgate electrodes to control the threshold voltages of MOS transistors formed in the SOI region.

11 Claims, 8 Drawing Sheets

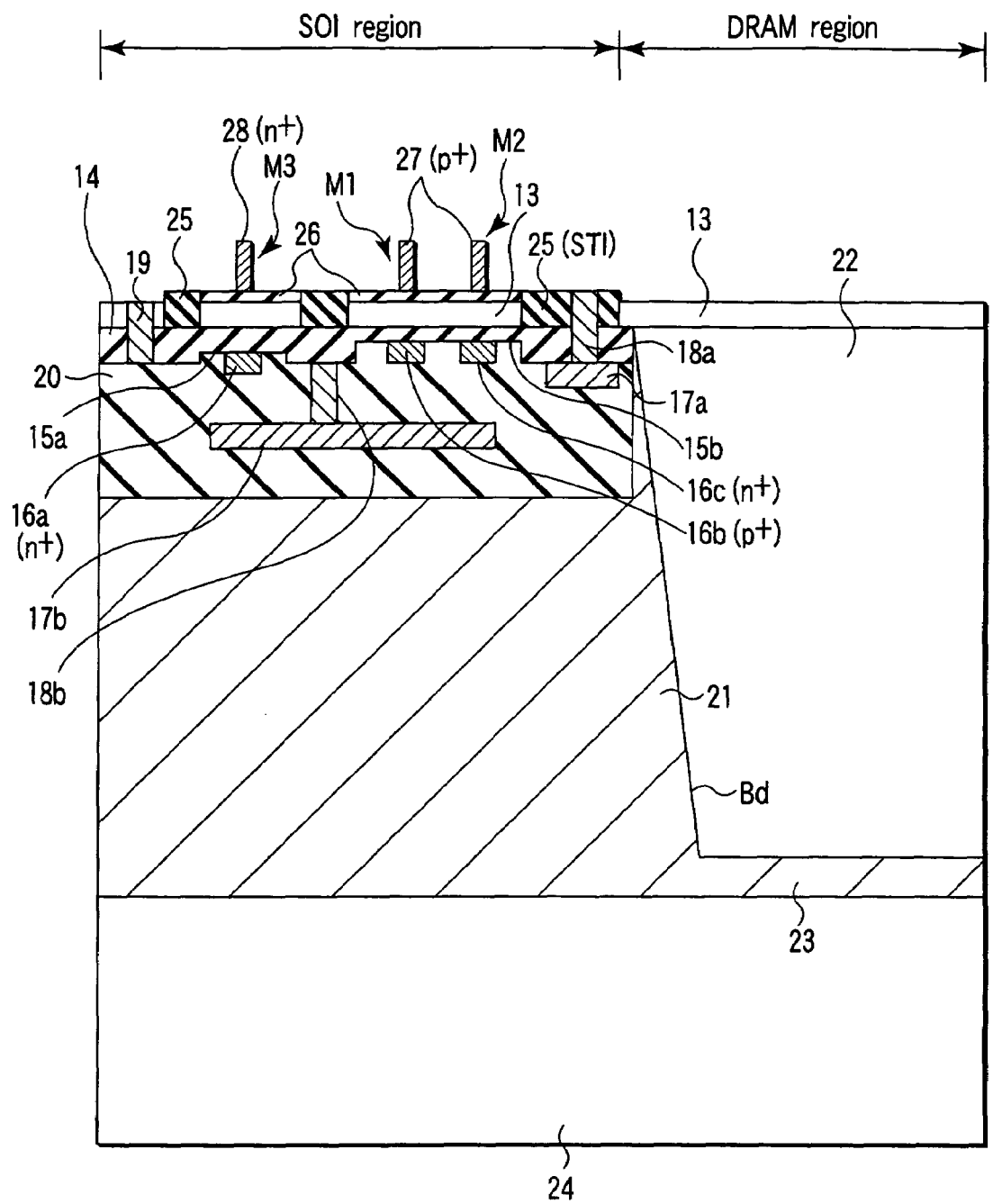
F I G. 1

SEMICONDUCTOR DEVICE WITH SOI REGION AND BULK REGION AND METHOD OF MANUFACTURE THEREOF

CROSS-REFERENCE TO RELATED APPLICAIONS

This application is based upon and claims the benefit of priority from the prior Japanese Patent Application No. 2002-259194, filed Sep. 4, 2002, the entire contents of which are incorporated herein by reference.

BACKGROUND OF THE INVENTION

1. Field of the Invention

The present invention relates to a semiconductor device using a partial SOI (Silicon On Insulator) substrate having an SOI region and a bulk region and a method of manufacture thereof.

2. Description of the Related Art

The partial SOI substrate has been expected to be promising as those of the next-generation of system LSIs with embedded memories. Up to now, the following methods of manufacturing the partial SOI substrate have been developed.

1. The partial SIMOX (Separation by Implanted Oxygen) method which involves ion implanting oxygen into a portion of a substrate to form a buried dielectric film into the oxygen-implanted portion.

2. The partial epitaxial growth method which involves exposing a portion of an SOI substrate by masking, removing the SOI and a buried dielectric film in the exposed portion, and forming a silicon layer on the exposed portion of the silicon substrate by means of epitaxial growth techniques. This method is disclosed in, for example, Japanese Unexamined Patent Publication No. 8-17694.

3. The partial BOX (Buried OXide) method which involves forming a buried oxide (BOX) layer as a buried dielectric film into a portion of the substrate surface and bonding the BOX side of the substrate to a support substrate.

With the SIMOX method, since oxygen is ion implanted into a portion of the substrate to form the buried dielectric film, crystalline defects will be developed in the silicon layer on the buried dielectric film. Moreover, much contamination is introduced into the silicon layer by transition metals. If, therefore, a semiconductor device is formed in the silicon layer, leakage current would increase. If the semiconductor device is a memory cell, the leakage current would cause a problem of the integrity of data stored in that cell.

With the partial epitaxial growth method, crystalline defects will occur at the interface between an epitaxial layer grown from the SOI layer and an epitaxial layer grown from the silicon substrate exposed as the result of removal of the dielectric film. Moreover, to remove topography introduced by the epitaxial layers so that the surface of one of the epitaxial layers is at the same level as the other layer, difficult planarization technology would be required.

With the partial BOX method, the resulting partial SOI substrate has an interface (the surface of bonding) between the substrate having the partial BOX layer formed in the bulk region and the support substrate. The interface is positioned at substantially the same depth as a well region in which semiconductor devices are formed. Thus, a problem arises in that the interface becomes a source of leakage.

Regardless of whether the substrate structure is bulk or SOI, when the gate sidewall width decreases with decreasing size of MOS transistors, it becomes impossible to ignore the degradation of the performance due to the short-channel effect. To suppress the short-channel effect, it is effective to form shallow source/drain regions.

With the system LSIs with embedded memories, on the other hand, it is required that the power consumption be reduced and the operating speed being increased. Accordingly, it is required that the supply voltage be lowered and the dimensions of devices be scaled down. To reduce the junction capacitance and leakage and make smaller-geometry devices, it is desired to use fully-depleted MOS transistors in which a depletion layer spreads across the entire region in the SOI layer (from drain to source) under a gate electrode. However, since the threshold voltage of the fully-depleted MOS transistors varies according to the thickness of the SOI layer, causing a problem of control of the threshold voltage. It is therefore difficult to produce fully-depleted MOS transistors suitable for practical use.

Furthermore, with the system LSIs with embedded memories, it is required to prevent interference between memory cells formed in the bulk region and logic circuits formed in the SOI region with certainty. For this reason, the demand has increased for developing a semiconductor device suitable for system LSIs with embedded memories which use partial SOI substrates and a method of manufacture thereof.

BRIEF SUMMARY OF THE INVENTION

According to an aspect of the present invention there is provided a semiconductor device comprising: an SOI region which includes a buried dielectric film formed in a semiconductor substrate and a silicon layer formed on the buried dielectric film; a bulk region formed next to the SOI region of the semiconductor substrate; MOS transistors formed within the silicon layer; and electrodes formed below the buried dielectric film in correspondence with the MOS transistors.

According to another aspect of the present invention there is provided a semiconductor device comprising: an SOI region including a buried dielectric film formed within a semiconductor substrate, a polysilicon layer formed below the buried dielectric film, and a silicon layer formed on the buried dielectric film; a bulk region formed next to the SOI region within the semiconductor substrate; a trench formed within the bulk region; and a diffused layer formed within the bulk region so that it is in contact with the trench, the difference between the interface between the polysilicon layer and the bulk region and the diffused layer being set larger than the width of a depletion layer defined by the impurity concentrations of the polysilicon layer and the bulk region and the potential difference between the diffused layer and the bulk region.

According to still another aspect of the present invention there is provided a method of manufacturing a semiconductor device comprising: forming a porous silicon layer over the surface of a first semiconductor substrate by means of anodization; forming a first silicon layer on the porous silicon layer by means of epitaxial growth techniques; forming a buried dielectric film on the first silicon layer; forming an electrode on the buried dielectric film in an SOI region of the first semiconductor substrate; covering the electrode with a dielectric film; exposing the first silicon layer by removing the buried dielectric film in a bulk region of the first semiconductor substrate; forming first and second polysilicon layers on the dielectric film and the first silicon layer, respectively, by means of epitaxial growth techniques; forming a second polysilicon layer on the first polysilicon layer and the second silicon layer; planarizing the surface of the first polysilicon layer and the surface of the second polysilicon layer on the second silicon layer so that the surface of the first polysilicon layer is at the same level as the second polysilicon layer; bonding a second semiconductor substrate to the planarized surfaces of the first and second polysilicon layers; and stripping the first semiconductor substrate off the porous silicon layer.

BRIEF DESCRIPTION OF THE SEVERAL VIEWS OF THE DRAWING

FIG. 1 is a sectional view of a semiconductor device according to a first embodiment of the present invention;

DETAILED DESCRIPTION OF THE INVENTION

Figure 2:
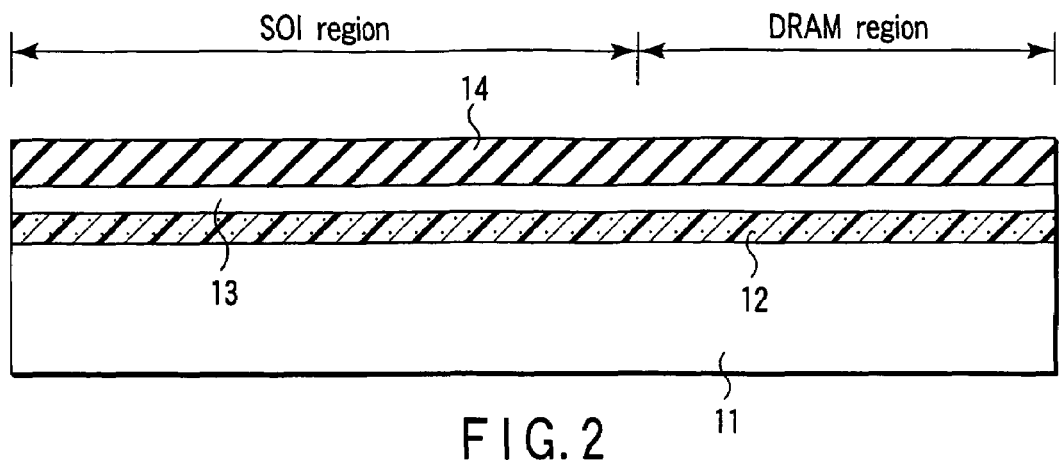
FIGS. 2 through 9 are sectional views, in the order of steps of manufacture, of the semiconductor device of FIG. 1.

The preferred embodiments of the present invention will now be described with reference to the accompanying drawings.

[First Embodiment]

FIG. 1 is a sectional view of a semiconductor device according to a first embodiment of the present invention. FIG. 1 shows an example of a logic LSI with embedded DRAM, which has a logic circuit formed in the SOI region and DRAM cells and peripheral circuits formed in the DRAM region constituted by the bulk region.

In FIG. 1, polysilicon layers 21 and 23 are formed on the surface of a support substrate 24. A silicon layer 22 is formed on the polysilicon layer 23 so that it adjoins the polysilicon layer 21. A BOX layer 14 is formed into the surface of the polysilicon layer 21 as a buried dielectric film. A silicon layer 13 is formed on the BOX layer 14 as an SOI layer. The silicon layer 13 is formed to extend over the silicon layer 22. The silicon layer 13 on the BOX layer 14 forms the SOI region and the silicon layers 22 and 13 form the DRAM region as an example.

In the SOI region, shallow-trench isolation (STI) regions 25 as device isolation regions are formed in the silicon layer 13. The region of the silicon layer 13 isolated by the STI regions 25 is formed on top with gate dielectric films 26. Gate electrodes 27 and 28 of MOS transistors M1, M2 and M3 are formed on the gate dielectric films 26. The gate electrodes 27 of the MOS transistors M1 and M2 are formed from P+ type polysilicon by way of example. The gate electrode 28 of the MOS transistor M3 is formed from n+ type polysilicon by way of example.

The BOX layer 14 is formed underneath with recesses 15a and 15b each of a different depth. That is, the recess 15b which is formed below the gate electrodes 27 is set deeper than the recess 15a formed below the gate electrode 28. This makes a difference in the thickness of the BOX layer 14 between its recessed portions 15a and 15b. That is, in this example, the thickness of the BOX layer 14 is set smaller in its portion corresponding to the gate electrodes 27 than in its portion corresponding to the gate electrode 28.

A backgate electrode 16a is formed on the bottom (the upper side in the drawing) of the recess 15a. Backgate electrode 16b and 16c are formed on the bottom (the upper side) of the recess 15b. The backgate electrodes 16a and 16c are formed from n+ polysilicon by way of example. The backgate electrodes 16c is formed from p+ polysilicon by way of example. Suitable setting of the backgate electrodes 16a, 16b and 16c and the recesses 15a and 15b allows the threshold voltages of the MOS transistors formed in the SOI layer to be optimized. To optimize the threshold voltages, it is required that the conductivity types of the backgate electrodes 16a, 16b and 16c be set suitably.

Interconnect layers 17a and 17b are formed under and below the BOX layer 14. These interconnect layers are made of, say, polysilicon. The interconnect layers 17a and 17b and the backgate electrodes 16a, 16b and 16c are insulated by an interlayer insulating film 20 which is in the form of, say, silicon oxide.

A via hole is formed in the BOX layer 14 and a via plug 18a is formed in that via hole to be connected to the interconnect layer 17a. The via plug 18a allows the application of electrical potential from the top side to the back side of the BOX layer 14. Also, a via hole is formed in the interlayer insulating film 20 and a via plug 18b is formed in the via hole to be connected to the interconnect layer 17b. The use of the via plugs 18a and 18b and the interconnect layers 17a and 17b allows the application of a predetermined potential to each of the backgate electrodes 16a, 16b and 16c. The electrical potential to be applied to each of the backgate electrodes is set arbitrarily to optimize the threshold voltage of the corresponding MOS transistor. As an example, ground potential is used.

The interconnect layers are not limited to those shown in FIG. 1; three or more levels of interconnections may be used.

Furthermore, an alignment mark 19 is formed in the SOI layer 13 and the BOX layer 14. The tip of the alignment mark 19 is exposed from the surface of the SOI film 13. This alignment mark is formed, for example, on a dicing line. The effect of the alignment mark is to provide alignment between the patterns on the rear and the top side of the BOX layer 14. The mark is used to align exposure masks with respect to the wafer. The use of the alignment mark 19 allows the patterns on the rear and the top side of the BOX layer 14 to be aligned with respect to each other.

Reference will now be made to FIGS. 2 through 9 to describe a method of manufacturing the semiconductor device shown in FIG. 1. In these figures, corresponding parts to those in FIG. 1 are denoted by like reference numerals.

As shown in FIG. 2, a porous silicon layer 12 is first formed over the surface of a silicon substrate 11 as a first semiconductor substrate through anodization. The anodization is carried out by means of the known epitaxial layer transfer (ELTRAN (R)) method by way of example. Specifically, fine holes which are several nanometers in diameter are formed in the surface of the silicon substrate 11 and extend inward by making it the anode and applying electric current in an ethanol-containing HF solution. In this manner, the porous silicon layer 12 is formed over the surface of the silicon substrate 11.

Subsequent to this process, the silicon layer 13 is formed on the surface of the porous silicon layer 12 by means of epitaxial growth techniques. The silicon layer 13 is next subjected to a thermal oxidation step, whereby the BOX layer 14 is formed on it.

Figure 3:
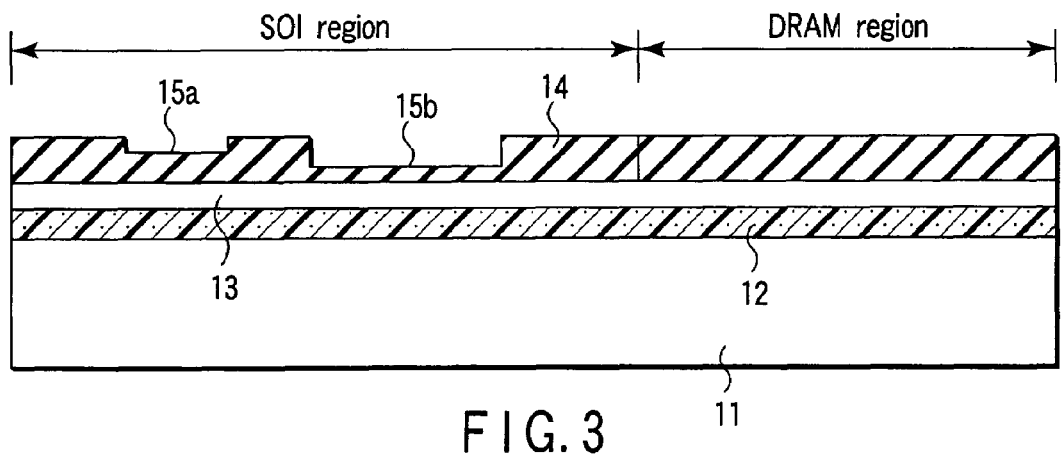

After that, as shown in FIG. 3, a mask (not shown) is formed on the surface of the BOX layer 14 and, using this mask, the BOX layer 14 is etched to form recesses 15a and 15b of different depths in the BOX layer in the SOI region. A method of forming the recesses 15a and 15b of different depths involves etching the BOX layer to form recesses of the same depth corresponding to the recesses 15a and 15b and then oxidizing the inside of one of the recesses. In the example of FIG. 3, the inside of the recess 15a is oxidized, so that it is made shallower than the recess 15b. This method is illustrative and not restrictive.

Figure 4:
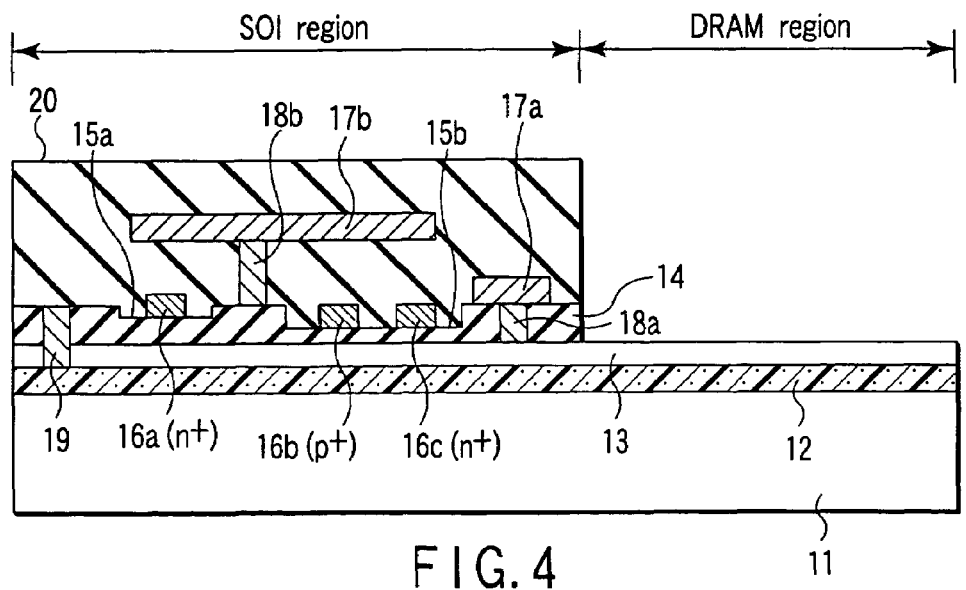

Next, as shown in FIG. 4, the via 18a is formed in the BOX layer 14 so that it reaches the SOI layer 13. The alignment mark 19 is formed in the BOX layer 14 and the SOI layer 13 so that it reaches the porous silicon layer 12. The backgate electrodes 16a, 16b and 16c, in the form of polysilicon, are formed on the bottoms of the recesses 15a and 15b. After that, the interconnect layers 17a and 17b and the via 18b are formed. Conventional manufacturing methods can be used to form the backgate electrodes 16a, 16b and 16c, the interconnect layers 17a and 17b, the vias 18a and 18b, and the alignment mark 19. The abovementioned order in which the backgate electrodes 16a, 16b and 16c, the interconnect layers 17a and 17b, the vias 18a and 18b, and the alignment mark 19 are formed is merely exemplary and not restrictive.

After that, the interlayer insulating film 20, in the form of, say, silicon oxide or silicon nitride, is deposited over the entire structure.

Next, a mask (not shown) is formed on the interlayer insulating film 20 in the SOI region. Using this mask, the interlayer insulating film 20 and the BOX layer 14 in the DRAM region are etched away, thus exposing the silicon layer 13 in the DRAM region.

Figure 5:
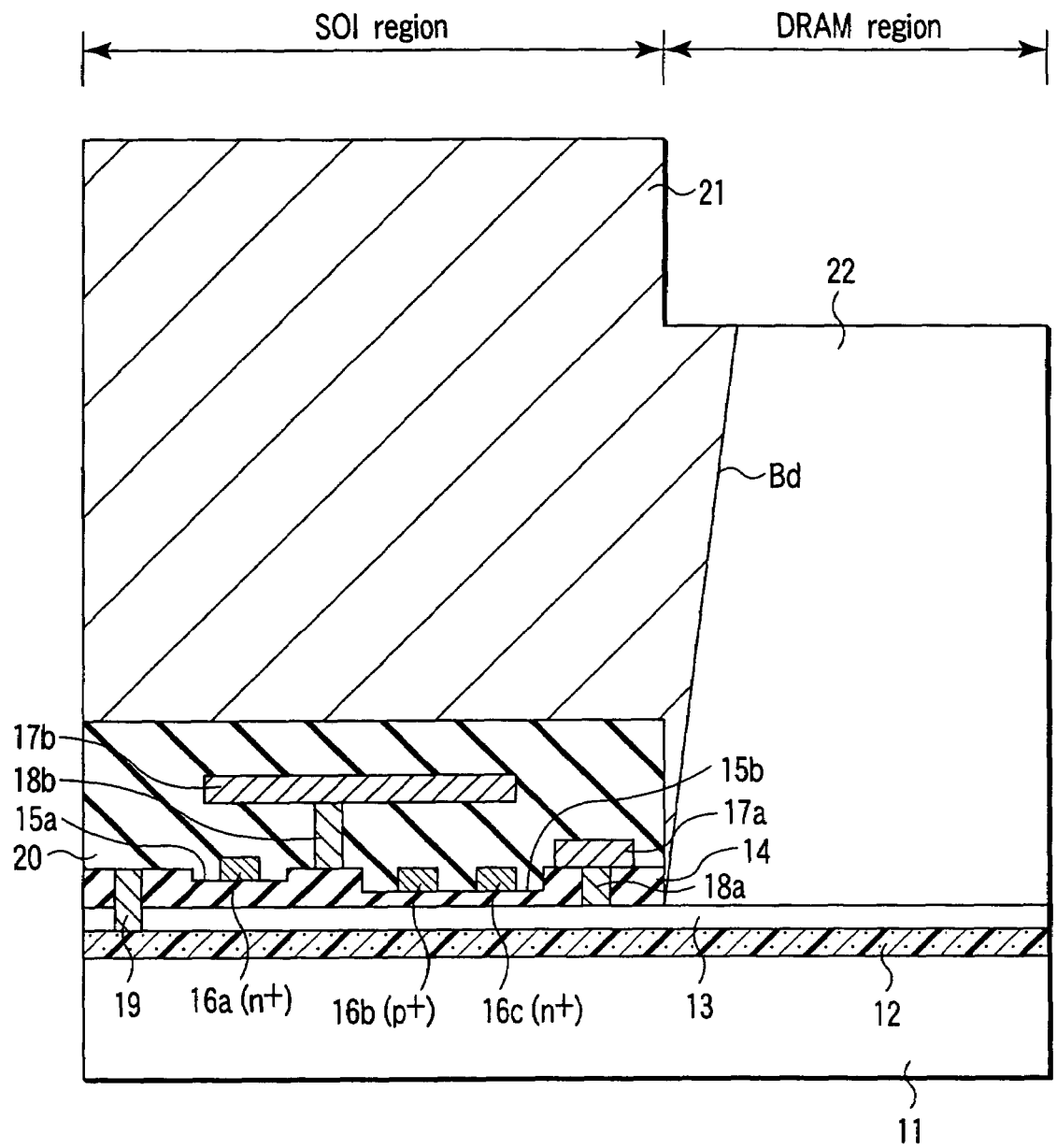

After that, as shown in FIG. 5, the polysilicon layer 21 is formed on the interlayer insulating film 20 in the SOI region and the silicon layer (monocrystalline silicon layer) 22 is formed on the silicon layer 13 in the DRAM region by means of, say, selective epitaxial growth techniques. At this point, polysilicon also grows from the side of the interlayer insulating film 20, causing the polysilicon layer 21 in the SOI region to gradually extend into the DRAM region. The interface Bd between the polysilicon layer 21 and the silicon layer 22 extends gradually into the DRAM region starting at the surface of the silicon layer 13 at the boundary between the SOI region and the DRAM region. The surface of the polysilicon layer 21 in the SOI region becomes higher than that of the silicon layer 22 in the DRAM region, creating a step therebetween.

Figure 6:
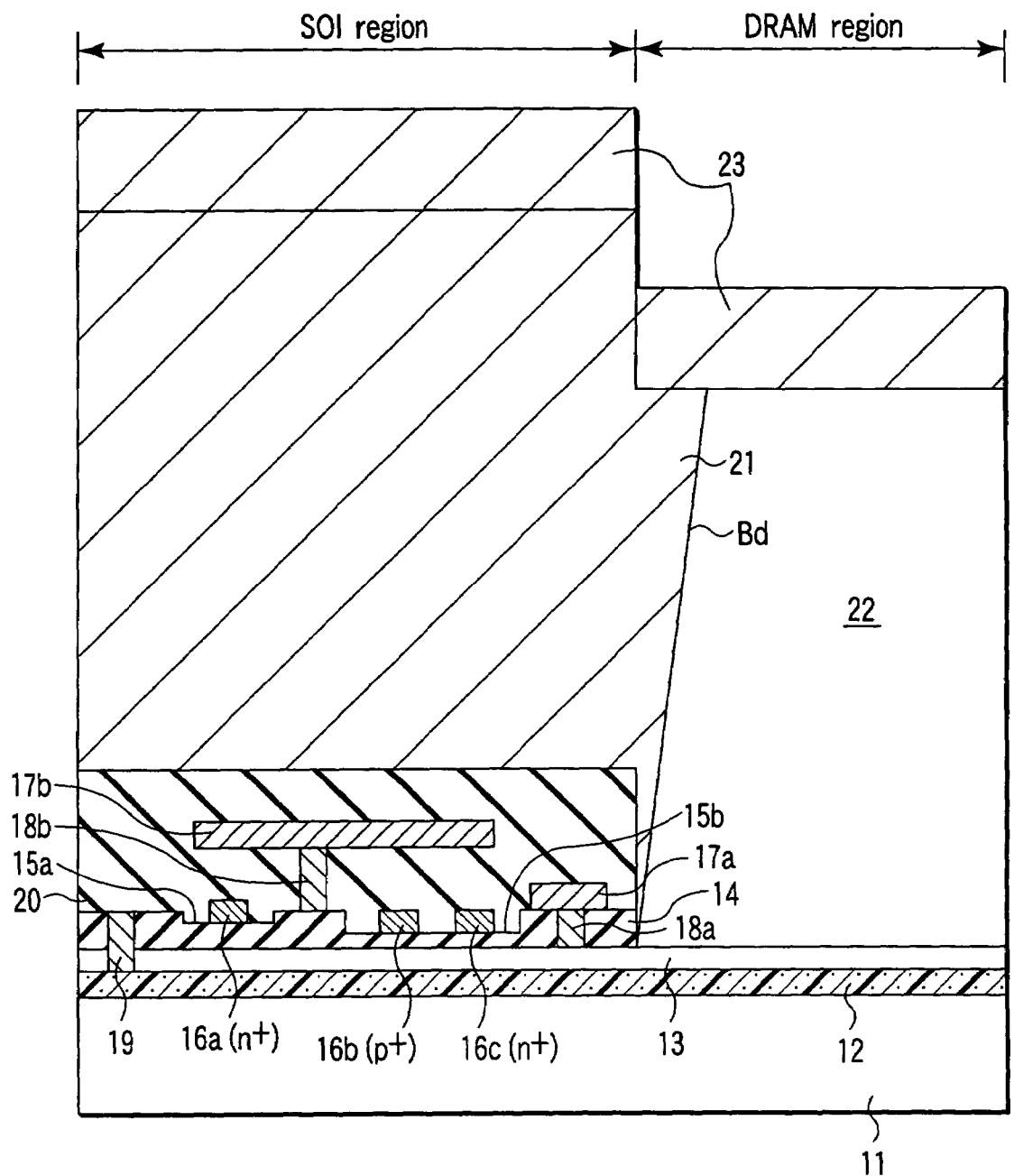

After that, as shown in FIG. 6, the polysilicon layer 23 is deposited over the entire surface of the resultant structure.

Figure 7:
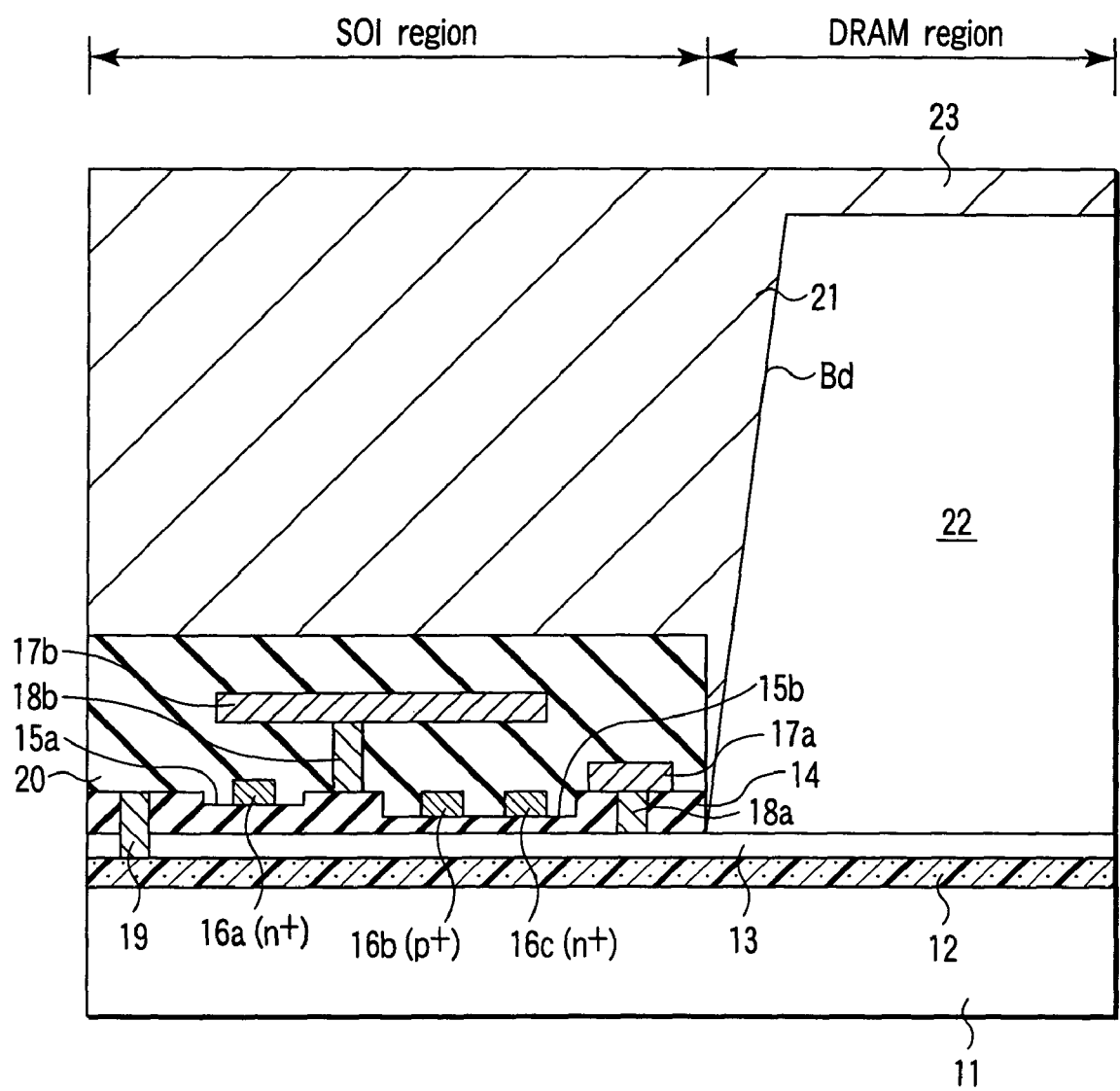

Next, as shown in FIG. 7, the entire surface is planarized so that the surface of the polysilicon layer 21 is at the same level as the polysilicon layer 23 on the silicon layer 22. For example, this planarization is achieved by chemical mechanical polishing (CMP). In CMP, the polysilicon layer 23 is uniform in the surface polishing rate, thus allowing the formation of a good planar surface.

Figure 8:
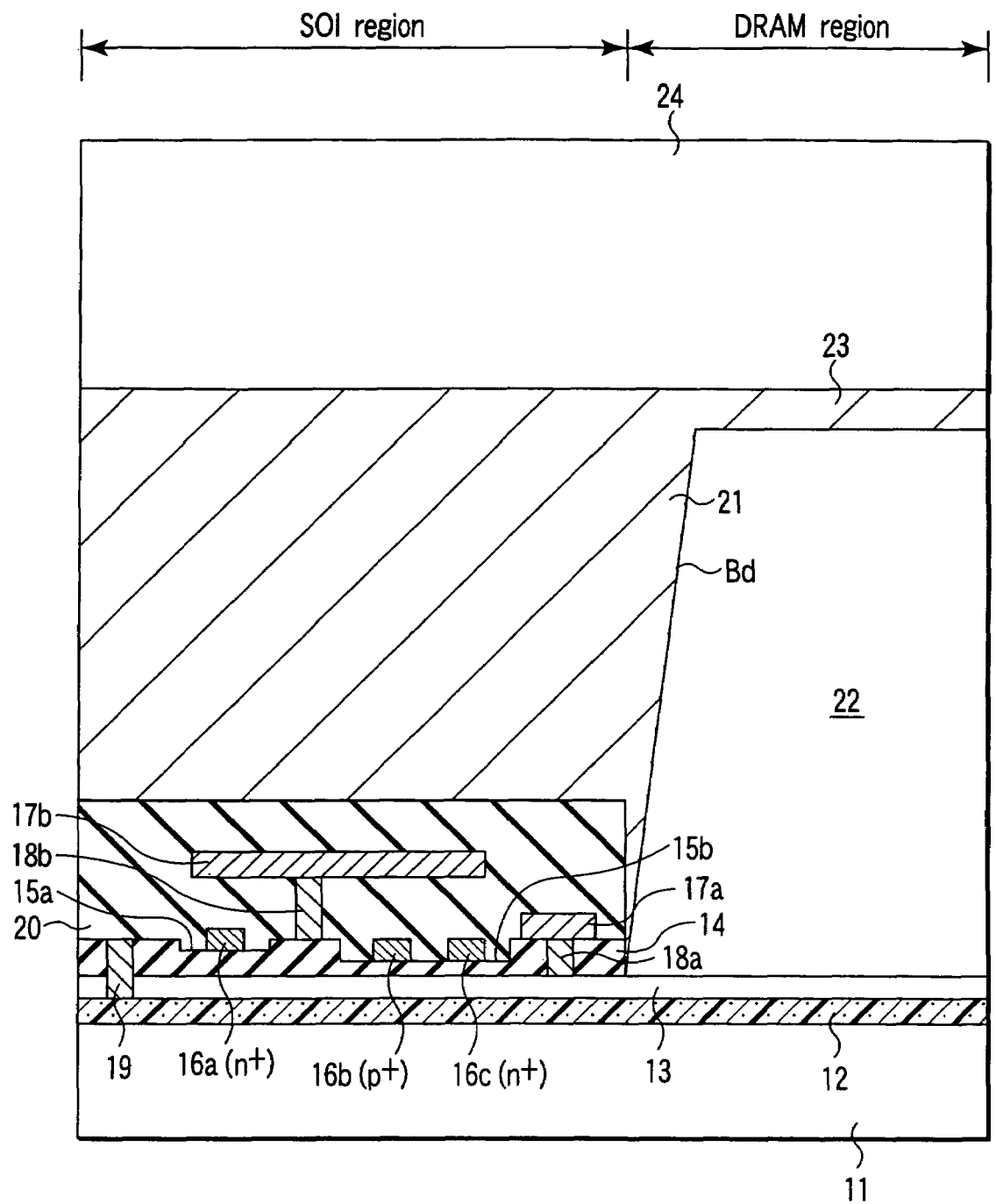

After that, as shown in FIG. 8, the support substrate 24 as a second semiconductor substrate is bonded to the surfaces of the polysilicon layers 21 and 23. The surface of the first semiconductor substrate consists of the polysilicon layers 21 and 23, which are formed of a homogenous material. For this reason, a uniform strength of adhesion to the support substrate can be obtained.

After that, the porous silicon layer 12 is removed by means of, say, a jet of water to strip off the silicon substrate 11 as the first semiconductor substrate. To strip off the silicon substrate 11, conventional etching techniques may also be used.

Figure 9:
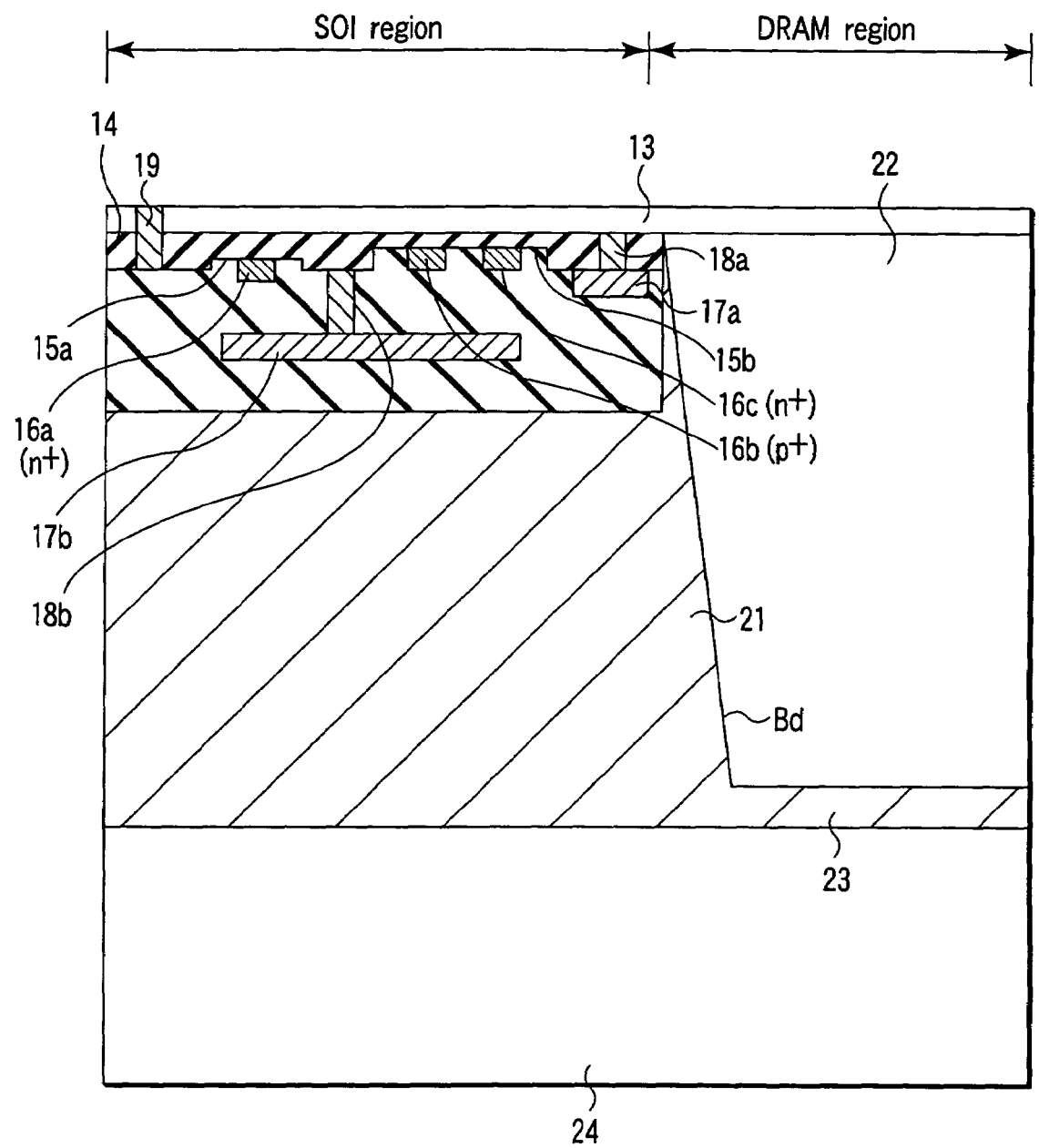

FIG. 9 shows the structure after the silicon substrate 11 was stripped off. After that, by forming MOS transistors in the SOI region using conventional techniques, the structure shown in FIG. 1 can be provided. Moreover, DRAM cells and peripheral circuits are formed in the DRAM region by conventional techniques.

According to the first embodiment, the backgate electrodes 16a 16b and 16c of the MOS transistors formed in the SOI region are formed on the back of the BOX layer 14. For this reason, the threshold voltages of the MOS transistors can be controlled by suitably setting the conductivity types of and the electrical potential applied to the backgate electrodes 16a, 16b and 16c. Thus, fully depleted MOS transistors can be formed in the SOI region.

In addition, the formation of the recesses 15a and 15b of different depths on the back of the BOX layer 14 allows the thickness of the BOX layer to be varied according to the threshold voltages of the MOS transistors formed in the SOI region. For this reason, the threshold voltages of the MOS transistors formed in the SOI region can also be controlled by varying the thickness of the BOX layer 14.

Furthermore, the via 18a is formed in the BOX layer 14 and the multi-level interconnect layers 17a and 17b and the via 18b are formed below the BOX layer 14. For this reason, a required electrical potential can be applied to each of the backgate electrodes 16a, 16b and 16c through the interconnect layers 17a and 17b and the vias 18a and 18b. Therefore, the threshold voltages of the MOS transistors in the SOI region can be controlled with certainty.

Also, the alignment mark 19 is provided in the BOX layer 14 and the SOI layer 13 so that its top and bottom ends are exposed from the SOI and BOX layers, respectively. For this reason, the patterns on the front and back sides of the BOX layer 14 can be aligned with respective to each other with certainty. Thus, finely structured devices can be fabricated with precision.

Additionally, since the silicon layer 13 formed on the porous silicon layer 12 has few defects, high-performance devices can be formed in that silicon layer.

Also, the polysilicon layer 21, placed below the BOX layer 14, has the gettering effect. For this reason, there are advantages that contamination introduced by transition metals can be prevented and leakage current can be suppressed.

Furthermore, the monocrystalline silicon layer 22, which is formed immediately to the side of the polysilicon layer 21, has no surface of adhesion. For this reason, there is no leakage current from the surface of adhesion and, when memory cells are formed within the silicon layer 22, the integrity of data stored in them can be maintained.

Moreover, the backgate electrodes 16a, 16b and 16c, the interconnect layers 17a and 17b, the vias 18a and 18b and the interlayer insulating film 20 can be formed over the BOX layer 14 before the silicon layer 11 is bonded to the support substrate 24. For this reason, they can be fabricated with ease.

In addition, the formation of the BOX layer 14, the recesses 15a and 15b, the backgate electrodes 16a, 16b and 16c, the interconnect layers 17a and 17b, the vias 18a and 18b, and the interlayer insulating film 20 involves high-temperature heat treatment. However, since the porous silicon layer 12 has resistance to heat, the silicon substrate 11 will not be stripped off during the heat treatment.

Also, the polysilicon layer 23 exists between the silicon layer 22 and the support substrate 24. The support substrate 24 is bonded to the homogenous surface of the polysilicon layers 21 and 23. Therefore, a sufficient strength of adhesion can be achieved at any point on the substrate.

Furthermore, the polysilicon layer 23 is formed over the entire surface of the silicon substrate 11 before the surface of the silicon substrate is planarized by CMP. For this reason, the entire surface of the silicon substrate 11 can be polished uniformly with a constant polishing rate.

[Second Embodiment]

Figure 10:
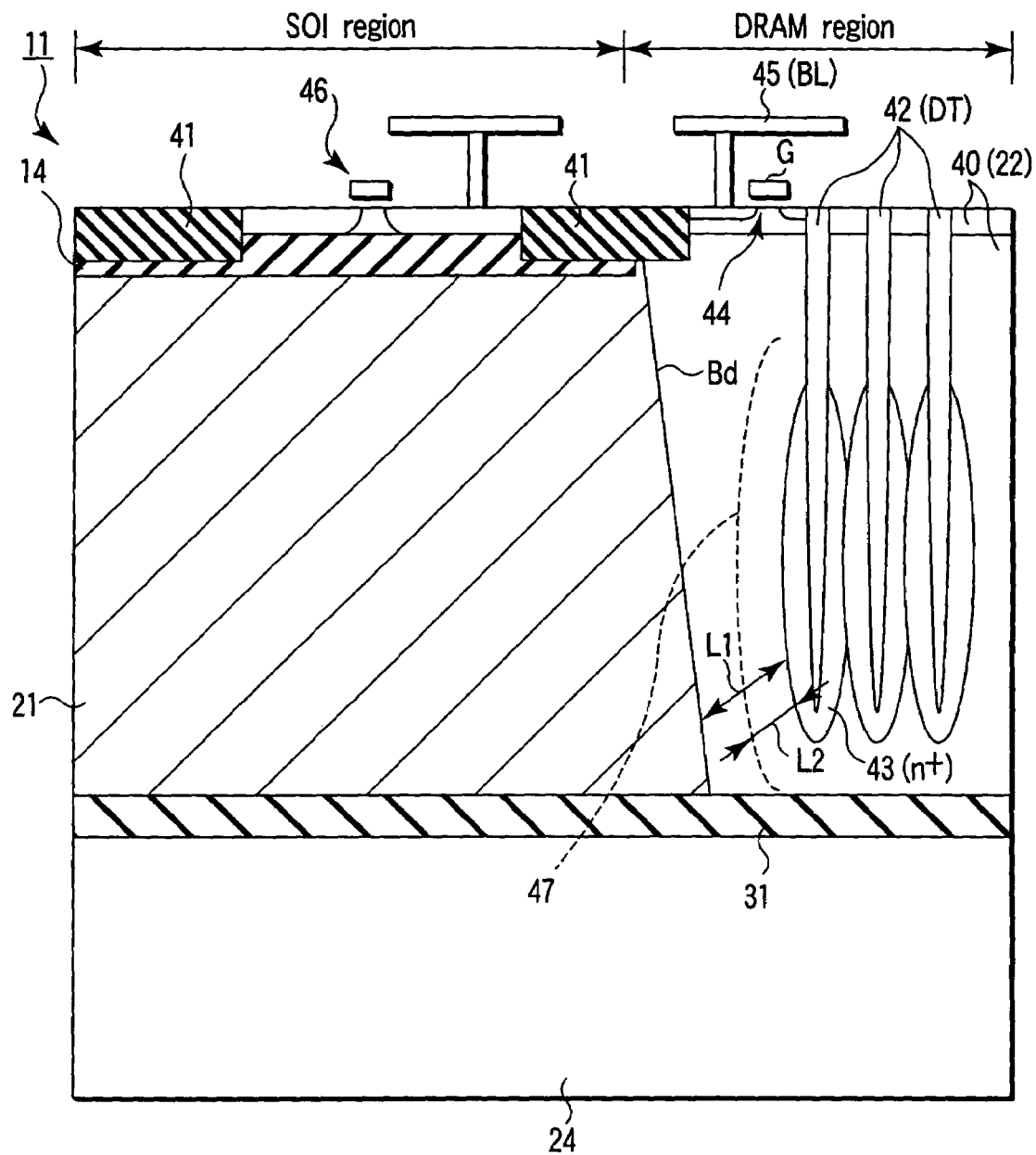
FIG. 10 is a sectional view of a semiconductor device according to a second embodiment of the present invention.

FIG. 10 illustrates, in sectional form, a semiconductor device according to a second embodiment of the present invention. In this figure, corresponding parts to those in FIG. 1 are denoted by like reference numerals and a description will be given below of only the different portions.

FIG. 10 shows a semiconductor device in which DRAM cells having trench capacitors are formed within the DRAM region as the bulk region. STI layers 41 are formed across the DRAM and SOI regions and around the devices. For example, p-type impurities are introduced into the silicon layer (22) to form a p-type well region 40. Deep trenches (DT) 42 that form trench capacitors are formed within the p-type well region 40. In the well region 40, for example, n+-type plate diffused layers 43 are formed around the trenches 42. In each trench, though not shown, a capacitor dielectric film and a storage electrode are formed. In the surface portion of the well region 40, the source/drain regions of MOS transistors 44 are formed. One of the source/drain regions of each MOS transistor is connected with the storage electrode of the corresponding trench capacitor. The other of the source/drain regions is connected to a bit line 45.

In the SOI region, MOS transistors 46 are formed, each of which is a fully depleted or partially depleted MOS transistor. The polysilicon layer 21 and the well region 40 are formed underneath with an oxide film 31. That is, this oxide film is formed on the side of the silicon substrate 11 as the first semiconductor substrate. The support substrate 24 and the silicon substrate 11 are bonded to each other with the oxide film 31 interposed therebetween. Even such a structure allows the silicon substrate 11 to be bonded to the support substrate 24 with a sufficient strength of adhesion.

In the above structure, a depletion layer 47 is formed around the plate diffused layer 43. The width L2 of the depletion layer is defined by the impurity concentrations of the plate diffused layer 43 and the well region 40 and the potential difference between them.

Of the trench capacitors formed within the well region 40, the trench capacitor formed nearest to the interface Bd between the polysilicon layer 21 and the well region 40 is set such that the shortest distance L1 between its plate diffused layer 43 and the interface Bd is longer than the width L2 of the depletion layer 47.

According to the second embodiment, the shortest distance L1 between the plate diffused layer 43 and the interface Bd is set longer than the width L2 of the depletion layer 47. This allows interference between the DRAM region and the SOI region to be prevented. Moreover, the trench capacitors can be placed as close to the SOI region as feasible. For this reason, with the same storage capacity, the size of the DRAM region could be reduced, which would prevent the chip size from increasing.

Although the present invention has been described in terms of a logic LSI with embedded DRAM, the principles of the present invention are equally applicable to a logic LSI with embedded SRAM or nonvolatile memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    an SOI region which includes a buried dielectric film formed in a semiconductor substrate and a silicon layer formed on the buried dielectric film;
    a bulk region formed next to the SOI region of the semiconductor substrate;
    MOS transistors formed within the silicon layer; and
    electrodes formed below the buried dielectric film in correspondence with the MOS transistors,
    wherein the buried dielectric film has first and second recesses of different depths formed on its surface opposite to the surface on which the silicon layer is formed, a first thickness in the first recess, and a second thickness less than the first thickness in the second recess.

2. The device according to claim 1, wherein the electrodes are backgate electrodes adapted to control the threshold voltage of the MOS transistors.

3. The device according to claim 1, further comprising interconnect lines formed below the buried dielectric film.

4. The device according to claim 3, wherein the interconnect lines are multi-level interconnect lines.

5. The device according to claim 4, further comprising an interlayer insulating film which covers the electrode and the interconnect lines.

6. The device according to claim 5, further comprising vias formed in the buried dielectric film and connected to the electrodes and the interconnect lines, the vias and the interconnect lines being adapted to apply electrical potential to the electrodes.

7. The device according to claim 6, wherein each of the MOS transistors is a fully depleted one.

8. The device according to claim 1, further comprising a mask alignment mark formed within the buried dielectric film and the silicon layer.

9. The device according to claim 1, further comprising a polysilicon layer formed below the buried dielectric film and the bulk region.

10. The device according to claim 9, further comprising a support substrate bonded to the polysilicon layer.

11. The device according to claim 1, wherein the bulk region is formed of monocrystalline silicon.

* * * * *